(12) United States Patent
Gealy et al.

(10) Patent No.: US 6,784,083 B1
(45) Date of Patent: Aug. 31, 2004

(54) METHOD FOR REDUCING PHYSISORPTION DURING ATOMIC LAYER DEPOSITION

(75) Inventors: F. Dan Gealy, Kura, ID (US); Cem Basceri, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/453,394

(22) Filed: Jun. 3, 2003

(51) Int. Cl.[7] .............................................. H01L 21/20
(52) U.S. Cl. ...................... 438/584; 438/680; 438/788
(58) Field of Search .............................. 438/680, 788, 438/584; 427/600, 248.1, 585; 118/715, 724

(56) References Cited

U.S. PATENT DOCUMENTS

| | | | | |
|---|---|---|---|---|
| 4,070,638 A | * | 1/1978 | Reeder | 333/150 |
| 5,569,502 A | * | 10/1996 | Koinuma et al. | 427/600 |
| 6,355,561 B1 | | 3/2002 | Sandhu et al. | 438/676 |
| 6,458,416 B1 | | 10/2002 | Derderian et al. | 427/301 |
| 6,461,436 B1 | | 10/2002 | Campbell et al. | 118/715 |

* cited by examiner

*Primary Examiner*—Hsien Ming Lee
(74) *Attorney, Agent, or Firm*—Williams, Morgan & Amerson

(57) ABSTRACT

The present invention provides a method and apparatus for an atomic layer deposition process. The apparatus includes a chamber adapted to receive a first precursor gas, at least one surface interior to the chamber, and an acoustic wave driver coupled to the at least one surface and adapted to drive acoustic waves along the interior surface.

25 Claims, 4 Drawing Sheets

METHOD FOR REDUCING PHYSISORPTION DURING ATOMIC LAYER DEPOSITION

BACKGROUND OF THE INVENTION

1. Field of the Invention

This invention relates generally to semiconductor processing, and, more particularly, methods and apparatus for atomic layer deposition processes.

2. Description of the Related Art

Atomic layer deposition is a technique for applying thin films to, for example, a semiconductor substrate. Although atomic layer deposition is a relatively new technology compared to, e.g. chemical vapor deposition, experimentation has shown that atomic layer deposition has an outstanding ability to form ultra-uniform thin deposition layers over complex topology. For example, atomic layer deposition processes have been used to deposit a one-atom-thick copper layer on a dielectric layer. For another example, a one-molecule-thick tantalum nitride barrier layer may be deposited on a low dielectric constant (low-K) dielectric film. Semiconductor devices formed using atomic layer deposition techniques may have length scales of 65-nanometers and below.

A typical atomic layer deposition process includes a sequence of gas flows. In one embodiment, a reactant precursor gas is provided to a reactor chamber in which a workpiece has been placed. For example, tri-methyl aluminum may be provided to the reactor chamber for about 0.5–10 seconds. Atoms or molecules in the first precursor gas form a saturated monolayer on the workpiece via chemisorption of the first precursor gas. A second precursor gas, e.g. a reducing and/or oxidizing gas, is then provided to the reactor chamber. For example, $H_2O$, $O_3$, or $NH_3$ gases may be provided to the reactor chamber for 0.5–10 seconds. The atoms or molecules in the second precursor gas are also chemisorbed to form a first atomic or molecular layer from the saturated monolayer. The atomic layer deposition process may be repeated to form a layer of any desired thickness.

The high reactivity of the two precursor gases may result in gas phase nucleation when the reactant precursor gas and the reducing and/or oxidizing precursor gas are both present in the reactor chamber. Particles formed by the gas phase nucleation may contaminate the workpiece and/or the reactor chamber. To reduce the amount of gas phase nucleation and the resulting contamination, the reactant precursor gas is typically purged from the reactor chamber before the reducing and/or oxidizing precursor gas is introduced into the reactor chamber. For example, the first reactant gas may be purged by injecting an inert gas such as argon into the reactor chamber. The reducing and/or oxidizing precursor gas may also be purged before other gases are introduced.

The duration of the purge depends, at least in part, on the degree and kinetics of the physisorption on interior surfaces of the reactor chamber. The precursor gases may be adsorbed onto surfaces in the reactor chamber when they are introduced into the reactor chamber, and the adsorbed precursor gases may then be desorbed during the purge. The desorbed precursor gases may increase the concentration of precursor gases in the reactor chamber during the purge step and thereby increase the time required to purge the chamber. For example, the reactor chamber may be purged for about 2–10 seconds, or until the concentration of the reactant gas falls to about $10^{10}$ atoms/cc. Consequently, the throughput of the atomic layer deposition process is limited, at least in part, by the duration of the purge.

SUMMARY OF THE INVENTION

In one aspect of the instant invention, an apparatus is provided for performing an atomic layer deposition process. The apparatus includes a chamber adapted to receive a first precursor gas, at least one surface interior to the chamber, and an acoustic wave driver coupled to the at least one surface and adapted to drive acoustic waves along the interior surface.

In one aspect of the present invention, a method is provided for performing an atomic layer deposition process. The method includes providing a surface acoustic wave to at least one surface in a chamber, providing a first precursor gas to the chamber concurrent with providing the surface acoustic wave, and removing a portion of the first precursor gas from the chamber.

BRIEF DESCRIPTION OF THE DRAWINGS

The invention may be understood by reference to the following description taken in conjunction with the accompanying drawings, in which like reference numerals identify like elements, and in which.

Figure 1:
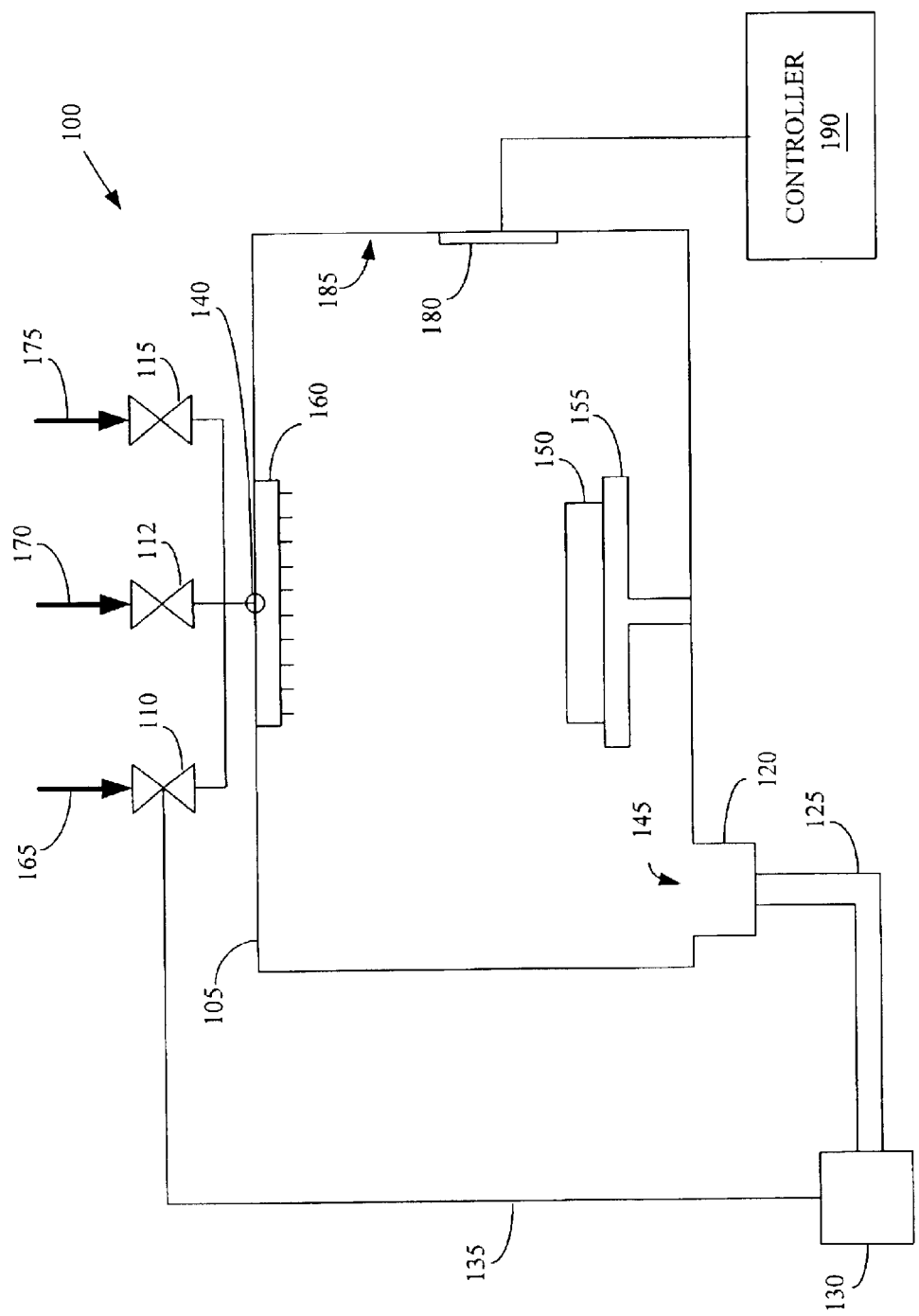
FIG. 1 is a schematic illustration of one exemplary atomic layer deposition apparatus, in accordance with one embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

FIG. 1 schematically illustrates an exemplary atomic layer deposition apparatus 100, in accordance with one embodiment of the present invention. The atomic layer deposition apparatus 100 includes a reactor chamber 105, a first dispensing valve 110, a purging valve 112, a second dispensing valve 115, an isolation valve 120, an exhaust foreline 125, an exhaust pump 130, and a dispensing foreline 135. Persons of ordinary skill in the art having benefit of the present disclosure will appreciate that only those elements of the exemplary atomic layer deposition apparatus 100 helpful for the understanding of the present invention are described herein. Additional elements, such as valves, lines, pumps, and the like may be included in the atomic layer deposition apparatus 100 without departing from the scope of the present invention.

In the illustrated embodiment, the reactor chamber 105 includes an inlet 140 coupled to the first dispensing valve 110, the purging valve 112, and the second dispensing valve 115. However, in alternative embodiments, the first dispensing valve 110, the purging valve 112, and the second dispensing valve 115 may be coupled to separate inlets. The reactor chamber 105 also includes an outlet 145 that is coupled to the isolation valve 120, which may be coupled to the exhaust pump 130 via the exhaust foreline 125.

A wafer 150 may be positioned on a heater 155 in the reactor chamber 105. For example, the wafer 150 may be a semiconductor substrate upon which an atomic layer is to be deposited. In the illustrated embodiment, the reactor chamber 105 also includes a showerhead 160 that is positioned substantially above the heater 155. The showerhead 160 is coupled to the inlet 140 such that the showerhead 160 is capable of receiving gases from the first dispensing valve 110, the purging valve 112, and the second dispensing valve 115.

During an atomic layer deposition process, a sequence of gas flows may be provided to the reactor chamber 105. In the illustrated embodiment, when the first dispensing valve 110 is open, a first precursor gas, indicated by the arrow 165, is selectively diverted so that it may flow through the inlet 140 to the showerhead 160 and into the reactor chamber 105. A first portion of the first precursor gas 165 may be deposited on the wafer 150 by, for example, chemisorption of the atoms and/or molecules in the first precursor gas 165. A second portion of the first precursor gas 165 may be adsorbed onto various interior surfaces, e.g. a surface 185, of the reactor chamber 105 by, for example, physisorption of the atoms and/or molecules in the first precursor gas 165.

When the first dispensing valve 110 is closed, the first precursor gas 165 may be selectively diverted so that it flows through the dispensing foreline 135 to the exhaust pump 130. However, in alternative embodiments, the first precursor gas 165 may be selectively diverted so that it flows through the dispensing foreline 135 to a second exhaust pump (not shown) or the first precursor gas 165 may not be selectively diverted when first dispensing valve 110 is closed.

The first precursor gas 165 may be purged from the reactor chamber 105. In one embodiment, the first precursor gas 165 is purged by introducing an inert gas, indicated by the arrow 170, through the purging valve 112. For example, argon gas may be introduced into the reactor chamber 105 by opening the purging valve 112. The first precursor gas 165 may also flow into the chamber outlet 145, through the isolation valve 120 and the exhaust foreline 125 to the exhaust pump 130. In one embodiment, the first precursor gas 165 may flow out of the reactor chamber 105 at the same time as the inert gas 170 is introduced into the reactor chamber 105. However, persons of ordinary skill in the art will.appreciate that, in alternative embodiments, the first precursor gas. 165 may begin flowing out of the reactor chamber 105 before or after the inert gas 170 is introduced into the reactor chamber 105. In addition, atoms and/or molecules that were adsorbed onto the reactor walls during the first precursor gas phase will begin to desorb during the purge phase. Desorption of the first precursor gas atoms and/or molecules from the reactor walls will increase with as the duration of the purge phase increases.

When the second dispensing valve 115 is open, a second precursor gas, indicated by the arrow 175, is selectively diverted so that it flows through the inlet 140 to the showerhead 160 and into the reactor chamber 105. A first portion of the second precursor gas 175 may be deposited on the wafer 150 by, for example, chemisorption of the atoms and/or molecules in the second precursor gas 175. The atoms and/or molecules in the second precursor gas 175 may also interact with atoms and/or molecules of the first precursor gas 165 that may remain in the reactor chamber 105. For example, atoms and/or molecules of the first precursor gas 165 that had previously been adsorbed onto the interior surfaces of the reactor chamber 105, and that remained after the purge phase, may be desorbed into the reactor chamber 105. This interaction may form particles (not shown) that may contaminate the wafer 150.

The reactor chamber 105 includes one or more acoustic wave drivers 180 that are capable of driving acoustic waves along the surface 185 interior to the reactor chamber 105. For example, as will be discussed in detail below, a controller 190 may provide an AC signal to the acoustic wave driver 180 to excite surface acoustic waves that travel along the surface 185. The surface acoustic waves may reduce adsorption of the first precursor gas 165 onto the interior surface 185 during the first precursor gas phase thus reducing the amount of time required for the purge phase to "clean" the reactor walls through desorption. The surface acoustic waves may also enhance desorption of the first precursor gas 165 from the interior surface 185 during the purge phase. Consequently, the concentration of the first precursor gas may be reduced more rapidly during the purge phase and the duration of the purge phase may be correspondingly reduced. Furthermore, the throughput of the atomic layer deposition apparatus 105 may be increased.

In a first illustrative embodiment, the surface 185 is an interior surface 185 of the reactor chamber 105. For example, the interior surface 185 may be an inner surface of a wall of the reactor chamber 105. In this embodiment, the one or more acoustic wave drivers 180 may be deployed on the interior surface 185 of the reactor chamber 105. For example, the one or more acoustic wave drivers 180 may be piezoelectric transducers deployed on the interior surface 185. Although not necessary for the practice of the present invention, additional acoustic wave drivers 180 may be deployed in the exhaust foreline 125.

Figure 2:
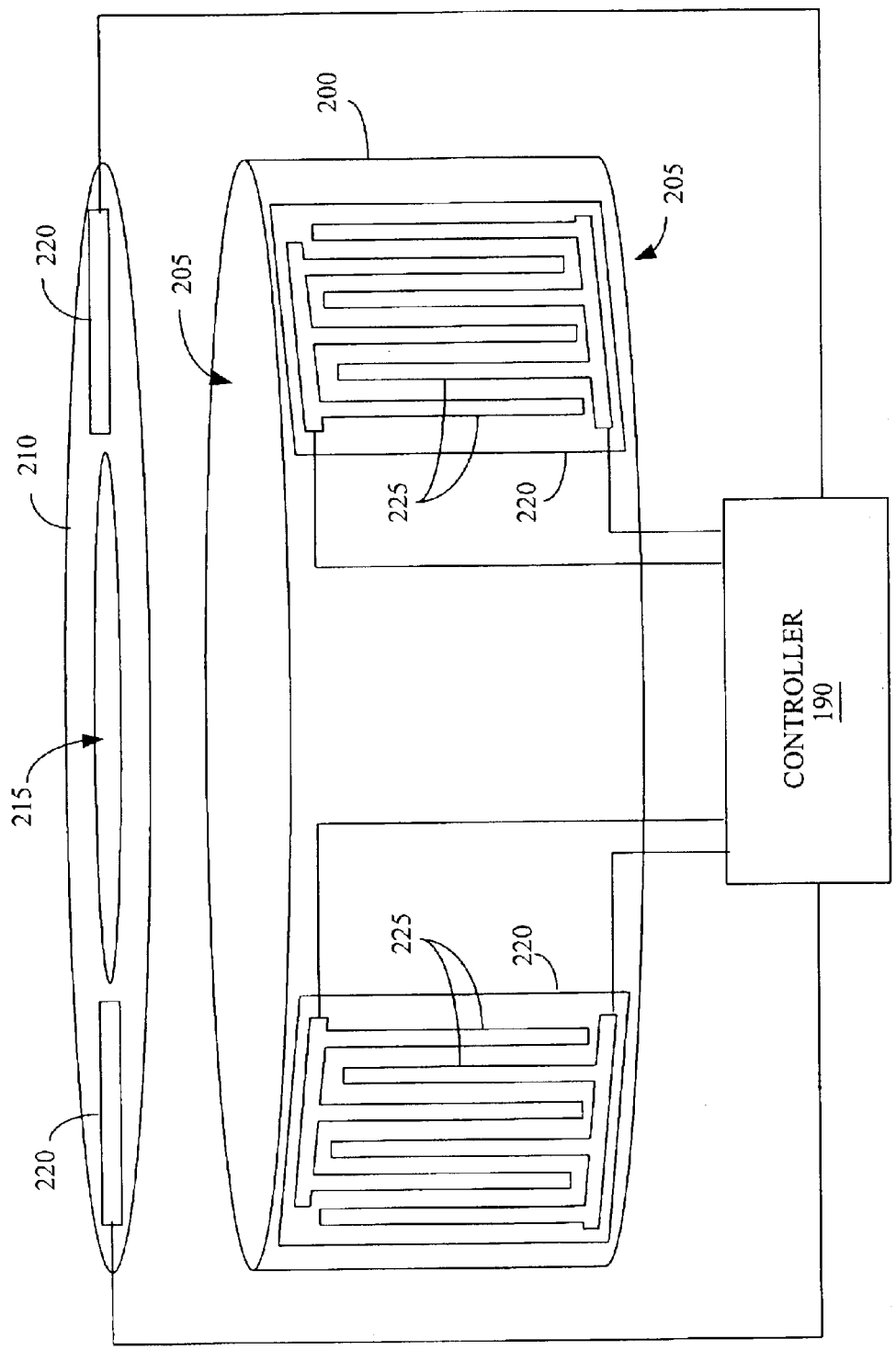
FIG. 2 shows a piezoelectric liner that may be used in the atomic layer deposition apparatus shown in FIG. 1.

In a second illustrative embodiment, illustrated in FIG. 2, the surface 185 may be a piezoelectric liner 200 that is deployed proximate at least a portion of the inner wall of the reactor chamber 105 shown in FIG. 1. For example, the piezoelectric liner 200 may be a quartz piezoelectric liner 200 that is deployed adjacent the vertical portion of the inner wall of the reactor chamber 105. In the illustrated embodiment, the piezoelectric liner 200 is a cylindrical piezoelectric liner 200 having upper and lower openings 205, which may allow access to the reactor chamber 105. However, the piezoelectric liner 200 may have any desirable shape such that it may be deployed adjacent any portion of the inner wall of the reactor chamber 105.

More than one piezoelectric liner 200 may be deployed within the reactor chamber 105. In one alternative embodiment, the piezoelectric liner 200 may be deployed adjacent the vertical portion of the inner wall of the reactor chamber and a second piezoelectric liner 210 may be deployed adjacent an upper horizontal portion of the inner wall of the reactor chamber 105. In the illustrated embodiment, the second piezoelectric liner 210 has an opening 215 to allow access to the reactor chamber 105. Although the second piezoelectric liner 210 shown in FIG. 2 is circular, the shape of the second piezoelectric liner 210 is a matter of design choice and not material to the present invention. Furthermore, in various alternative embodiments, additional piezoelectric liners 200, 210 may be deployed in the reactor chamber 105. For example, a third piezoelectric liner (not shown) may be deployed adjacent a lower horizontal portion of the inner wall of the reactor chamber 105.

One or more acoustic wave drivers 220 are deployed on the piezoelectric liners 200, 210. In the illustrated embodiment, the acoustic wave drivers 220 include at least one pair of interdigital electrodes 225, which are coupled to the controller 190. In operation, the controller 190 provides a first AC signal having a first polarity to a first one of each pair of interdigital electrodes 225 and a second AC signal having a second polarity, opposite to the first polarity, to a second one of each of the pair of interdigital electrodes 225. As is well known to those of ordinary skill in the art, the resulting variable voltage difference between the pair of interdigital electrodes 225 excites surface acoustic waves that travel along the piezoelectric liners 200, 210.

Figure 3A:
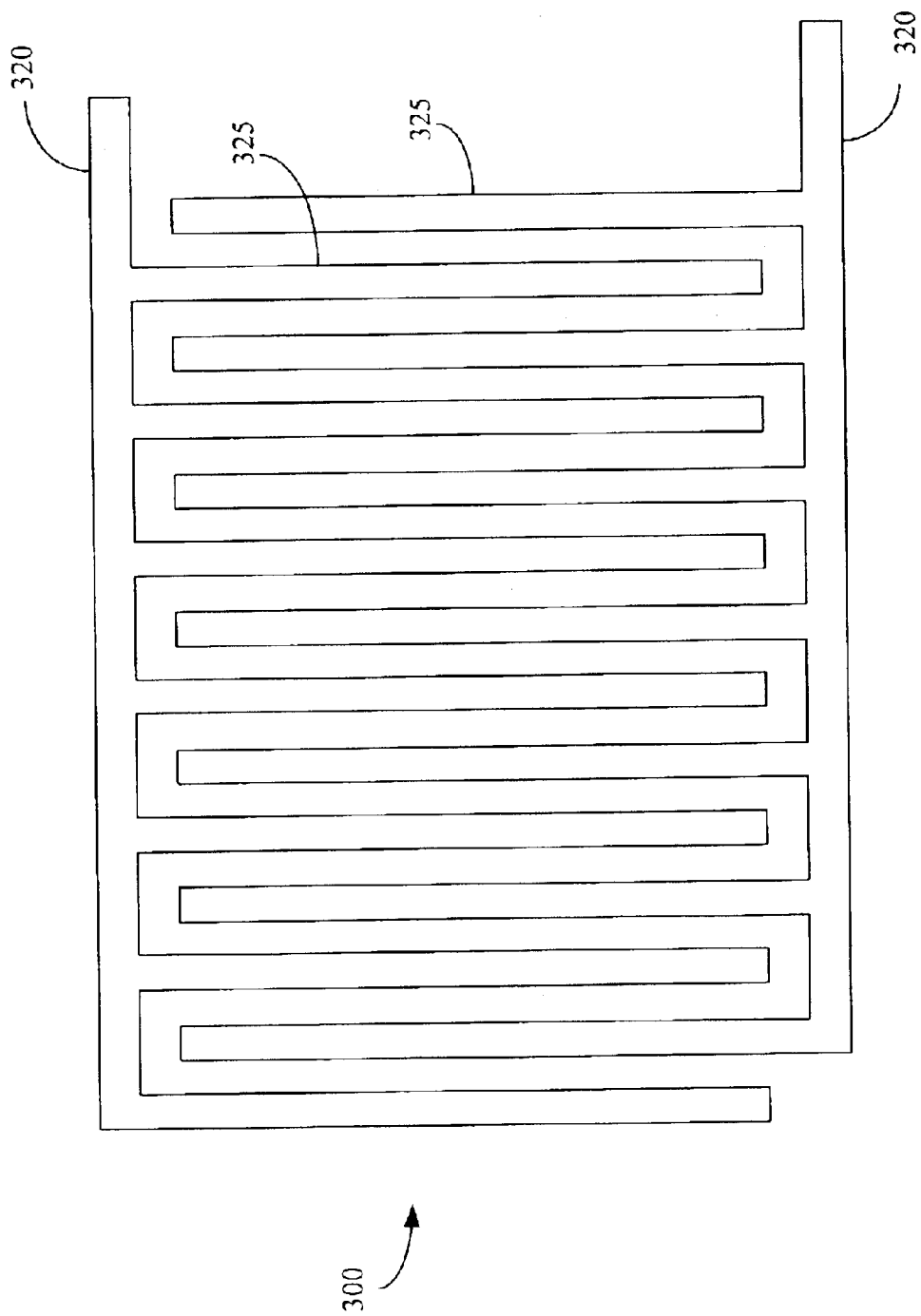
FIGS. 3A and 3B show exemplary embodiments of interdigital electrodes that may be used in the atomic layer deposition apparatus shown in FIG. 1.
Figure 3B:
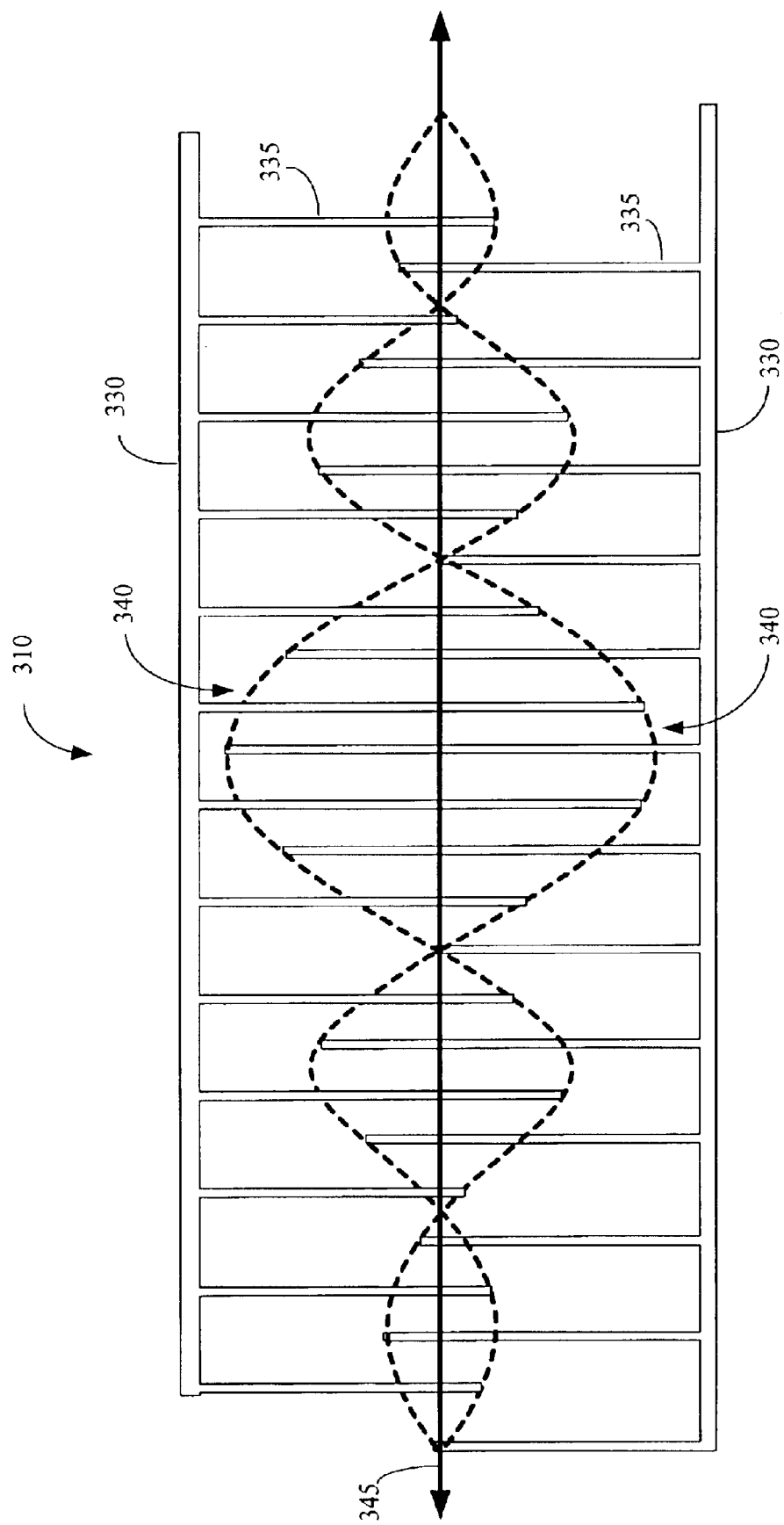

FIGS. 3A and 3B show first and second exemplary embodiments of the interdigital electrode pairs 300, 310, respectively. In the first exemplary embodiment of the interdigital electrode pair 300 shown in FIG. 3A, each of the interdigital electrodes 300 includes a conductive backbone 320 that is electrically coupled to a plurality of conductive prongs 325. The first and second AC signals may be transmitted to the plurality of conductive prongs 325 via the conductive backbone 320. The number, length, and spacing of prongs 325 is a matter of design choice and should not be considered as a limitation to the present invention except to the extent specifically set forth in an appended claim.

A spectrum of the surface acoustic waves produced by the interdigital electrode pair 300 depends on the geometry of the conductive backbone 320 and the conductive prongs 325. In the embodiment illustrated in FIG. 3A, the conductive prongs 325 are all approximately the same length. Consequently, the interdigital electrode pair 300 produces a broad-band spectrum of surface acoustic waves when provided with the first and second AC signals. For example, the surface acoustic waves may be excited at approximately the same frequency as the first and second AC signals.

In the second exemplary embodiment of the interdigital electrode pair 310 shown in FIG. 3B, the interdigital electrodes 300 each include a conductive backbone 330 that is electrically coupled to a plurality of conductive prongs 335, as in the first exemplary embodiment. However, in the second exemplary embodiment, the lengths of the conductive prongs 335 are selected to provide a predetermined frequency response, i.e. the interdigital electrodes 310 are apodized. For example, in FIG. 3B, the lengths of the conductive prongs 335 are selected to overlap in a region indicated by the dashed lines 340, which approximately correspond to a profile given by sin(x)/x, where the variable x indicates a displacement along the direction corresponding to the axis 345.

The apodized interdigital electrode pair 310 acts as a band pass filter when provided with the first and second AC signals. In the illustrated embodiment, the spectrum of the surface acoustic waves that may be formed by the apodized interdigital electrode pair 310 corresponds approximately to the Fourier transform of the profile sin(x)/x. Although the apodized interdigital electrode pair 310 shown in FIG. 3B implements, a band pass filter corresponding to the profile sin(x)/x, this is a matter of design choice and should not be considered as a limitation of the present invention except to the extent specifically set forth in an appended claim. Alternative embodiments of the present invention may implement any desirable band pass using any desirable profile.

The spectrum of the acoustic waves may be varied by changing the geometry of the interdigital electrode pairs 300, 310, changing the AC signal, or any combination of the two. In one embodiment, a spectrum of frequencies is selected based upon the composition of the first precursor gas. For example, a range of frequencies, e.g. the band ranging from about 100 Hz to about 200 kHz, may be selected based upon the mass of the molecules in the first precursor gas. In one embodiment, a midpoint frequency within the selected range of frequencies may then be increased when the mass of the molecules in the first precursor gas is decreased and decreased when the mass of the molecules in the first precursor gas is increased. Alternatively, the range of frequencies may be selected, e.g. increased or decreased, based upon the composition of the first precursor gas.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
providing a surface acoustic wave to at least one surface in a chamber, the surface acoustic wave having a frequency range selected to reduce adsorption of a first precursor gas onto the at least one surface;
providing the first precursor gas to the chamber concurrent with providing the surface acoustic wave; and
removing a portion of the first precursor gas from the chamber.

2. The method of claim 1, wherein providing the surface acoustic wave comprises providing a first and second AC signal to a first and second electrode, respectively, and wherein the first and second AC signals have opposite polarities.

3. The method of claim 1, wherein selecting the range of frequencies comprises selecting the range of frequencies based upon the composition of the first precursor gas.

4. The method of claim 3, selecting the range of frequencies comprises selecting the range of frequencies based upon a mass of the molecules in the first precursor gas.

5. The method of claim 4, wherein selecting the range of frequencies comprises selecting a midpoint frequency in the range of frequencies, and further comprising decreasing the selected midpoint frequency when the mass of the molecules in the first precursor gas is increased.

6. The method of claim 4, wherein selecting the range of frequencies comprises selecting a midpoint frequency in the range of frequencies, and further comprising increasing the selected midpoint frequency when the mass of the molecules in the first precursor gas is decreased.

7. The method of claim 1, wherein select the range of frequencies comprises selecting frequencies from about 100 Hz to about 200 kHz.

8. The method of claim 1, wherein providing the fist precursor gas comprises opening a valve coupled to the chamber.

9. The method of claim 8, wherein removing the portion of the first precursor gas comprises removing the portion of the first precursor gas using a pump.

10. The method of claim 1, wherein removing the portion of the first precursor gas from the chamber comprises removing the portion of the first precursor gas from the chamber concurrent with providing the surface acoustic wave.

11. The method of claim 1, further comprising providing a second precursor gas to the chamber after removing the portion of the first precursor gas from the chamber.

12. A method for performing an atomic layer deposition process, comprising:

introducing a workpiece in a chamber;

providing a surface acoustic wave to at least one interior surface in the chamber, the surface acoustic wave having frequency range selected to reduce adsorption of a first precursor gas onto the at least one surface; and introducing the first precursor gas into the chamber.

13. The method of claim 12, further comprising removing at least a portion of the first precursor gas.

14. The method of claim 13, wherein removing the portion of the first precursor gas comprises removing the portion of the first precursor gas using a pump.

15. The method of claim 13, further comprising introducing a purge gas into the chamber to remove at least a portion of the first precursor gas.

16. The method of claim 13, further comprising continuing to provide the surface acoustic wave to the at least one interior surface in the chamber while removing at least a portion of the first precursor gas.

17. The method of claim 13, further comprising introducing a second precursor gas into the chamber after removing at least a portion of the first precursor gas.

18. The method of claim 17, further comprising providing the surface acoustic wave to the at least one interior surface in the chamber while introducing the second precursor gas into the chamber.

19. The method of claim 17, further comprising:

removing at least a portion of the second precursor gas from the chamber; and re-introducing the fit precursor gas into the chamber while providing the surface acoustic wave to the at least one interior surface in the chamber.

20. The method of claim 12, wherein providing the surface acoustic wave comprises providing a first and second AC signal to a first and second electrode, respectively, and wherein the first and second AC signals have opposite polarities.

21. The method of claim 12, wherein selecting the range of frequencies comprises selecting the range of frequencies based upon the composition of the first precursor gas.

22. The method of claim 21, selecting the range of frequencies comprises selecting the range of frequencies based upon a mass of the molecules in the first precursor gas.

23. The method of claim 22, wherein selecting the range of frequencies comprises selecting a midpoint frequency in the range of frequencies, and further comprising decreasing the selected midpoint frequency when the mass of the molecules in the first precursor gas is increased.

24. The method of claim 22, wherein selecting the range of frequencies comprises selecting a midpoint frequency in the range of frequencies, and further comprising increasing the selected midpoint frequency when the mass of the molecules in the first precursor gas is decreased.

25. The method of claim 12, wherein selecting the range of frequencies comprises select frequencies ranging from about 100 Hz to about 200 kHz.

* * * * *

UNITED STATES PATENT AND TRADEMARK OFFICE
CERTIFICATE OF CORRECTION

PATENT NO. : 6,784,083 B1
DATED : August 31, 2004
INVENTOR(S) : Gealy et al.

It is certified that error appears in the above-identified patent and that said Letters Patent is hereby corrected as shown below:

Column 7,
Line 4, delete "fist" and insert -- first --.

Column 8,
Line 11, delete "fit" and insert -- first --.

Signed and Sealed this

Twenty-first Day of December, 2004

JON W. DUDAS
*Director of the United States Patent and Trademark Office*